(12) United States Patent
Henson

(10) Patent No.: US 6,919,599 B2
(45) Date of Patent: Jul. 19, 2005

(54) SHORT CHANNEL TRENCH MOSFET WITH REDUCED GATE CHARGE

(75) Inventor: Timothy Henson, Torrance, CA (US)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 10/603,461

(22) Filed: Jun. 25, 2003

(65) Prior Publication Data

US 2004/0065920 A1 Apr. 8, 2004

Related U.S. Application Data

(60) Provisional application No. 60/392,910, filed on Jun. 28, 2002.

(51) Int. Cl.$^7$ ............................................. H01L 29/772
(52) U.S. Cl. .................. 257/331; 257/329; 257/330; 257/341; 257/342; 257/492; 257/493
(58) Field of Search .................................... 257/492, 493, 257/341, 342, 409, 329, 330, 332, 334, 335, 302

(56) References Cited

U.S. PATENT DOCUMENTS

| | | | | | |
|---|---|---|---|---|---|
| 5,442,214 A | * | 8/1995 | Yang | ........................... | 257/328 |
| 5,929,481 A | * | 7/1999 | Hshieh et al. | ............... | 257/328 |
| 6,262,453 B1 | * | 7/2001 | Hshieh | ........................ | 257/341 |
| 6,657,254 B2 | * | 12/2003 | Hshieh et al. | ............... | 257/330 |
| 2001/0048116 A1 | * | 12/2001 | Standing et al. | ............. | 257/177 |

* cited by examiner

Primary Examiner—Tom Thomas
Assistant Examiner—Matthew Landau
(74) Attorney, Agent, or Firm—Ostrolenk, Faber, Gerb & Soffen, LLP

(57) ABSTRACT

A trench-type MOSgated device including high conductivity regions formed at the bottom of its trenches and field relief regions at or below the bottom of its channel region.

17 Claims, 7 Drawing Sheets

PRIOR ART

US 6,919,599 B2

SHORT CHANNEL TRENCH MOSFET WITH REDUCED GATE CHARGE

RELATED APPLICATION

This application is based on and claims priority to U.S. Provisional Application No. 60/392,910, filed on Jun. 28, 2002, entitled Design of Super Junction Short Channel Trench MOSFET with Reduced Gate Charge.

FIELD OF THE INVENTION

The present invention relates to semiconductor devices and more particularly to trench-type power semiconductor switching devices.

BACKGROUND OF THE INVENTION

FIG. 1 shows a portion of the active region of a trench-type power MOSFET according to the prior art. As is well known, such prior art devices include a number of spaced trenches 10 each extending through channel region 12 of the device.

Referring to FIG. 2, under reverse bias the electric field near the bottom corners of each trench 10 is high due to the crowding of the field lines. The high electric field concentration near the bottom corners of trenches 10 may result in breakdown which is an undesirable condition in that it may lead to hot carrier injection into the gate oxide, causing breakdown voltage walkout and an unreliable gate oxide.

The performance of conventional trench-type MOSFETs is sensitive to the depth of trenches. Generally, the deeper the trenches the lower the breakdown voltage and the lower the ON resistance (Rdson). Thus, in the design of trench-type MOSFETs the depth of trenches must be taken into account to obtain a device with a desired combination of Rdson and breakdown voltage rating.

An important characteristic of a trench-type MOSFET is its gate charge (Qg). The gate charge of a trench-type MOSFET is proportional to the area covered by the gate oxide 14 of the device and is naturally dependent on the depth of the trenches 10.

One component of Qg is the gate to drain charge (Qgd) which is determined by the portion of gate oxide 14 that overlaps the drain region 16 of the device. Shallow trenches, i.e., trenches that do not extend sufficiently below channel region 12, do not provide for sufficient overlap between the gate oxide 14 in the trenches 10 and the drain region 16 which is a factor contributing to the increase in Rdson. Unacceptably low overlap between the gate oxide 14 and the drain region 16 of the device may be due to the variation in the depth of trenches.

To avoid such a result, in prior art devices, the overlap of gate oxide 14 and the drain region 16 is designed to be relatively large in order to account for the trench depth variation.

For example, Qgd has been reduced in prior art devices by using a thick oxide at the bottom of the trench. To obtain the thick oxide the trench sidewalls are protected from oxidation by a material, which is then removed to grow the gate oxide on the sidewalls of the trenches. This method does not eliminate the gate to drain overlap due to trench depth variation.

It is desirable, therefore, to have a way of controlling the overlap of the gate oxide and the drain region independent of the trench depth to obtain a lower Qgd.

It is also desirable to reduce the depth of trenches without significantly increasing Rdson thus obtaining a lower Qg for the device.

SUMMARY OF THE INVENTION

A semiconductor device according to the present invention is a trench-type MOSgated device which includes high conductivity regions formed at the bottom of its trenches. Providing the high conductivity regions allows:

1) the gate to drain overlap to be controlled independent of trench depth, resulting in better control of Qgd;

2) the gate to drain overlap to be made smaller than the prior art devices, resulting in lower Qgd;

3) the MOSFET channel region to be made shorter without reducing breakdown voltage, resulting in lower Qg and possibly lower Rdson.

A device according to the present invention also includes field relief regions which serve to move the location of breakdown from the trench corners to the bulk silicon to increase reliability. The field relief regions are of the opposite conductivity to the high conductivity regions at the bottom of the trenches. According to one aspect of the invention the conductivity of the field relief regions is approximately the same as the conductivity of the high conductivity regions in order to take advantage of the superjunction effect so that the Rdson of the device may be reduced by shortening the channel.

Other features and advantages of the present invention will become apparent from the following description of the invention which refers to the accompanying drawings.

DETAILED DESCRIPTION OF THE EMBODIMENTS

Figure 3:
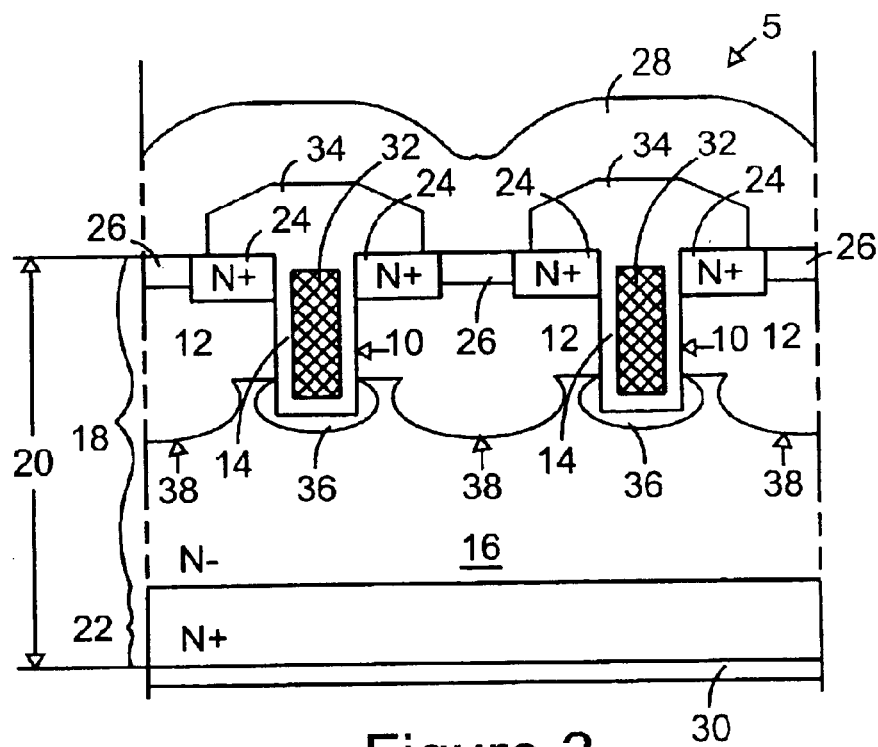
FIG. 3 shows a cross-sectional view of a portion of the active region of a semiconductor device according to the first embodiment of the present invention.

Referring to FIG. 3, semiconductor device 5 according to the first embodiment of the present invention includes an active region formed in the trench receiving region 18 of a semiconductor die 20. The trench receiving region 18 in the preferred embodiment of the present invention may be an epitaxially grown layer of monocrystalline silicon which is formed over a substrate 22. Substrate 22 in the preferred embodiment of the present invention may be a float zone type die of silicon of the same conductivity type as the trench receiving layer 18 doped with a higher concentration of dopants than the trench receiving layer 18. For example, substrate 22 and epitaxial layer 18 may be doped with N-type dopants.

Semiconductor device 5 also includes channel region 12, a plurality of trenches 10 formed in trench receiving layer 18 which extend through channel region 12, source regions 24 formed in channel region 12, and high conductivity contact regions 26. Source regions 24 are of the opposite conductivity type to that of channel region 12, and high conductivity contact regions 26 are of the same conductivity type as, but of higher concentration of dopants than channel region 12. Device 5 also includes source contact 28 which is in ohmic contact with source regions 24 and high conductivity contact regions 26, and drain contact 30 which is in ohmic contact with substrate 22 as is well known in the art. Also, as is well known in the art, each of trenches 10 includes a gate oxide layer 14 at its sidewalls and a gate electrode 32 formed from polysilicon. Each gate electrode 32 is insulated from source contact 28 by a respective insulation plug 34.

According to a first aspect of the present invention, semiconductor device 5 includes high conductivity regions 36 of the same conductivity type as drain region 16 formed at the base of each trench 10. For example, in the embodiment shown by FIG. 3, device 5 includes high conductivity regions 36 of N-conductivity type but of higher concentration of dopants than the concentration of dopants in drain region 16. High conductivity regions 36 are formed by implanting dopants of the same conductivity type as drain region 16 when trenches 10 are formed in trench receiving layer 18, and serve to control the gate to drain overlap independent of the depth of trenches 10.

According to an aspect of the present invention, high conductivity regions 36 when appropriately doped can create a conductive region between drain region 16 and the bottom of each trench 10, thereby allowing trenches 10 to be made the same depth or shallower than channel region 12, thus overcoming the problems associated with shallow trenches in the prior art devices.

According to another aspect of the present invention, device 5 includes field relief regions 38. Field relief regions 38 are regions of the same conductivity type as channel region 12 which extend below the depth of the channel region 12, and preferably to a depth below the depth of trenches 10. Field relief regions 38 may be formed as set forth in co-pending U.S. patent application Ser. No. 10/437, 984, filed May 13, 2003, entitled Trench MOSFET with Field Relief Feature and assigned to the assignee of the present application. Field relief regions 38 serve to move the location of breakdown away from the corners of trenches 10, thereby improving the breakdown voltage of device 5.

Figure 4:
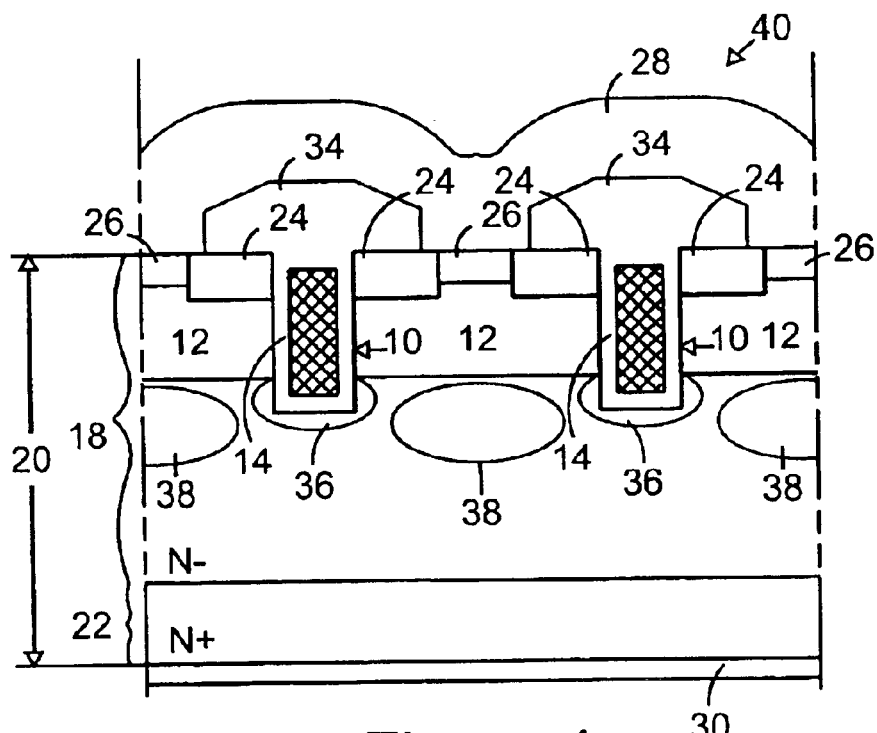
FIG. 4 shows a cross-sectional view of a portion of the active region of a semiconductor device according to the second embodiment of the present invention.

In semiconductor device 5 according to the first embodiment of the present invention, field relief region 38 merge with channel region 2. Referring to FIG. 4, a semiconductor device 40 according to the second embodiment of the present invention includes field relief regions. 38 which are spaced from channel region 12. Otherwise, semiconductor 40 according to the second embodiment of the invention includes all of the features of semiconductor device 5 (first embodiment).

According to an aspect of the present invention high conductivity regions 36 include a similar concentration of dopants as that of field relief regions 38.

When comparing the present invention with prior art, it should be noted that the present invention can have shallower trenches and shallower channel regions 12. The overlap of gate oxide 14 with drain region 16 is also smaller and better controlled in a device according to the present invention.

Table 1 summarizes some initial simulation results for devices according to the present invention. The data in Table 1 indicate that the breakdown voltage (BV) is reduced when high conductivity regions 36 are provided at the bottom of trenches 10 (see cases 1B, 2B), but that field relief regions 38 (cases 1c, 2c) increase BV even beyond the BV of prior art devices (1A, 2A). As a result, the depth of trenches 10 can be successfully reduced from 1.9 μm to 1.2 μm with no reduction in BV. The reduction in trench depth corresponds to a reduction in Qg. The gate to drain overlap is also much less in a device according to the present invention when compared to prior art devices (e.g., 1A) resulting in lower Qgd.

TABLE 1

| Device | Trench Depth (μm) | N-implant (regions 36) | Field Relief Regions (38) | Simulated Breakdown Voltage |
|---|---|---|---|---|
| 1A | 1.9 | no | no | 132 |
| 1B | 1.9 | yes | no | 101 |
| 1C | 1.9 | yes | yes | 144 |
| 2A | 1.2 | no | no | 132 |
| 2B | 1.2 | yes | no | 98 |
| 2C | 1.2 | yes | yes | 150 |

Referring to Table 1, the designation A refers to a device according to prior art, the designation B refers to a device which includes high conductivity regions 36, and the designation C refers to a device that includes high conductivity regions 36 and field relief regions 38. It should be noted that in the simulations neither high conductivity regions 36 nor field relief regions 38 were optimized. As a result, without optimization, it was observed that Rdson was increased. For example, 2X'a Rdson was 16% higher than that of IC. It is believed that Rdson for devices 1C and 2C was higher than devices 1A and 2A because of the loss of part of the epitaxial layer due to field relief regions 38. One skilled in the art would recognize that through optimization a desired combination of Rdson and breakdown voltage rating may be achieved.

Figure 1:
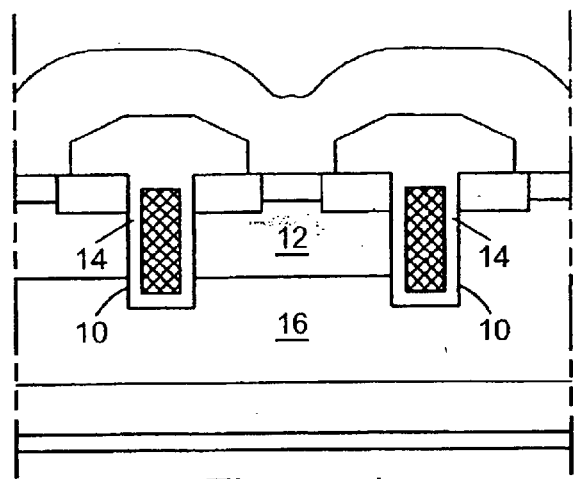
FIG. 1 shows a portion of the active region of a trench-type MOSFET according to prior art.
Figure 2:
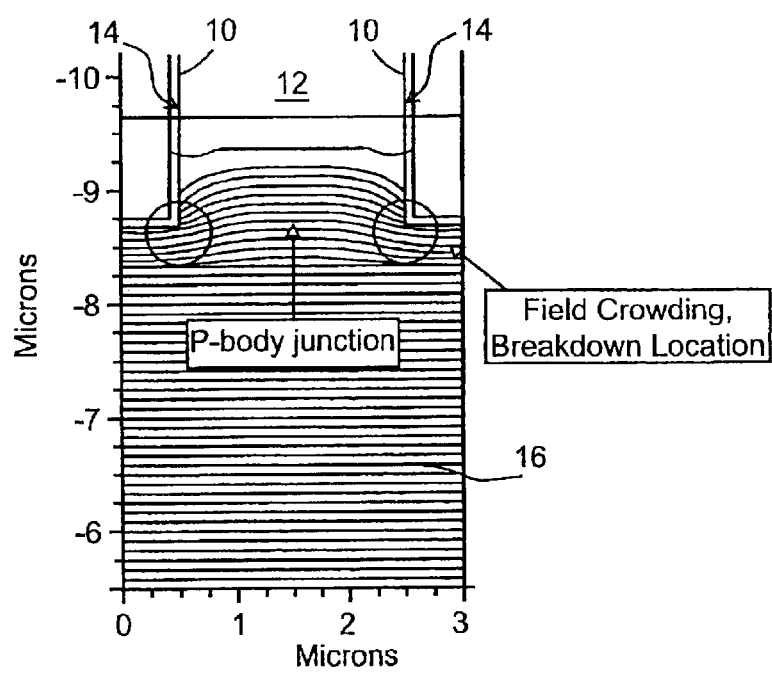
FIG. 2 illustrates the disposition of electric field lines near the bottom corners of the trench-type device of FIG. 1.
Figure 5C:
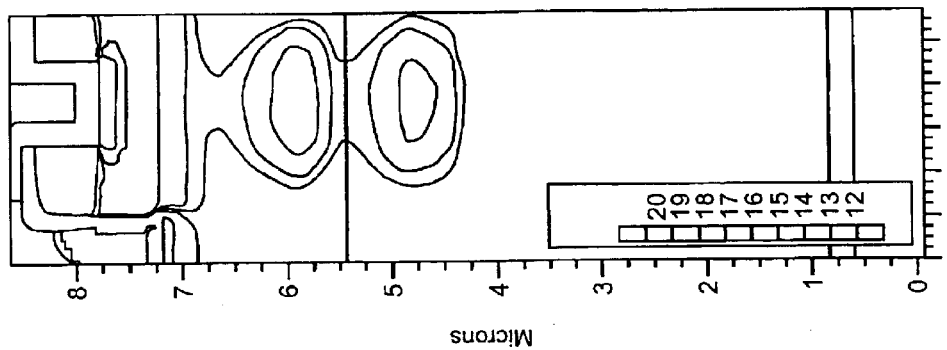
FIGS. 5A–5C show net doping profiles for three simulated devices.
Figure 5B:
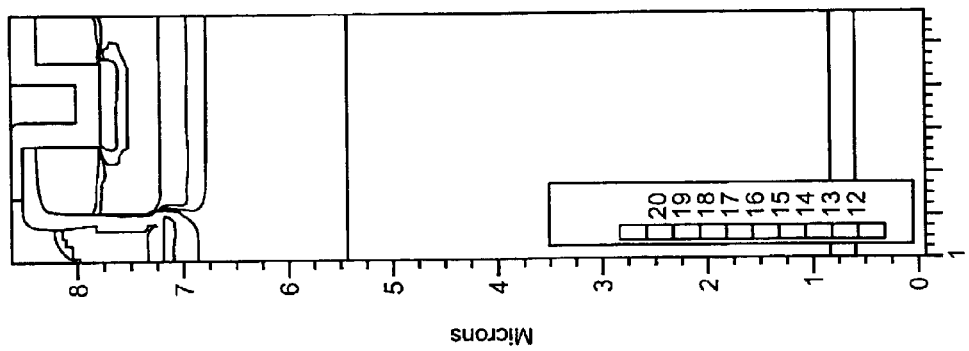
Figure 5A:
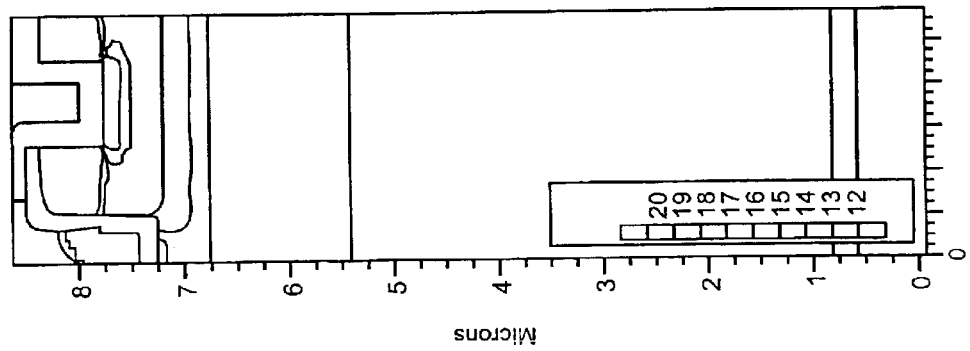

FIGS. 5A, 5B and 5C show respectively the net doping for simulated devices 2A, 2B, 2C (1.2 μm trench). Device 2A represents a modification to the prior art device of FIG. 1 (device 2A) with a shallower trench. Simulations have shown that device 2A would exhibit an Rdson twice that of device 1A because its channel region 12 extends past the trench bottom. On the other hand, device 2B which includes high conductivity regions 36 would exhibit an Rdson that is only 22% greater than device 1A, with a significantly reduced BV. Simulations, however, have shown that device 2C would have improved BV compared to device 1A or device 2A. It is believed that the simulations show an increase in the Rdson because field relief regions 38 reduce the amount of epitaxial layer which can be used for conduction. The Rdson may be improved through optimization.

Figure 6C:
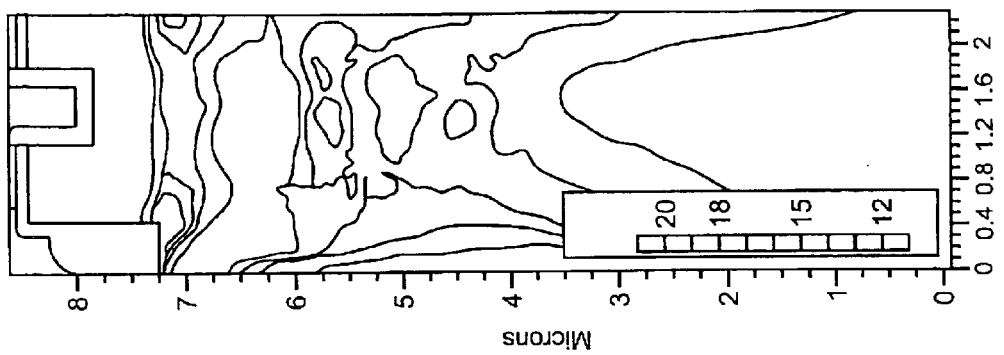
FIGS. 6A–6C show impact generation rate plots for three simulated devices.
Figure 6B:
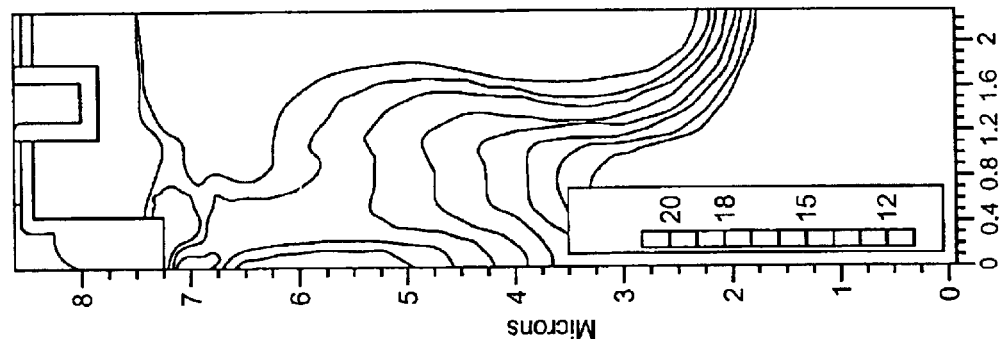
Figure 6A:
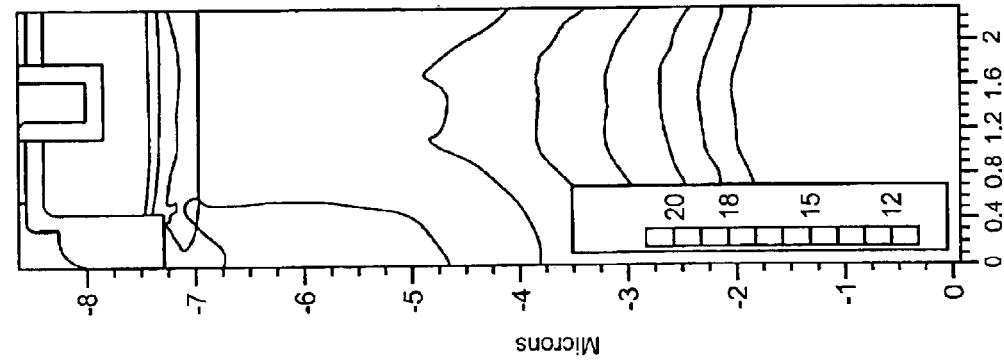

FIGS. 6A, 6B, and 6C respectively show plots of impact generation rate showing breakdown location for simulated devices 2A, 2B, 2C (1.21 μm trench). The plots show that adding high conductivity regions 36 only (e.g., device 2B) reduces breakdown voltage, while adding both high conductivity regions 36 and field relief regions 38 (e.g., device 2C) increases breakdown voltage. The simulation of device 2C (FIG. 6C) shows breakdown at the bottom trench corner. Higher concentration of dopants in field relief regions 38 may move the breakdown location away from the trenches and to the bulk silicon (not shown here).

Figure 7B:
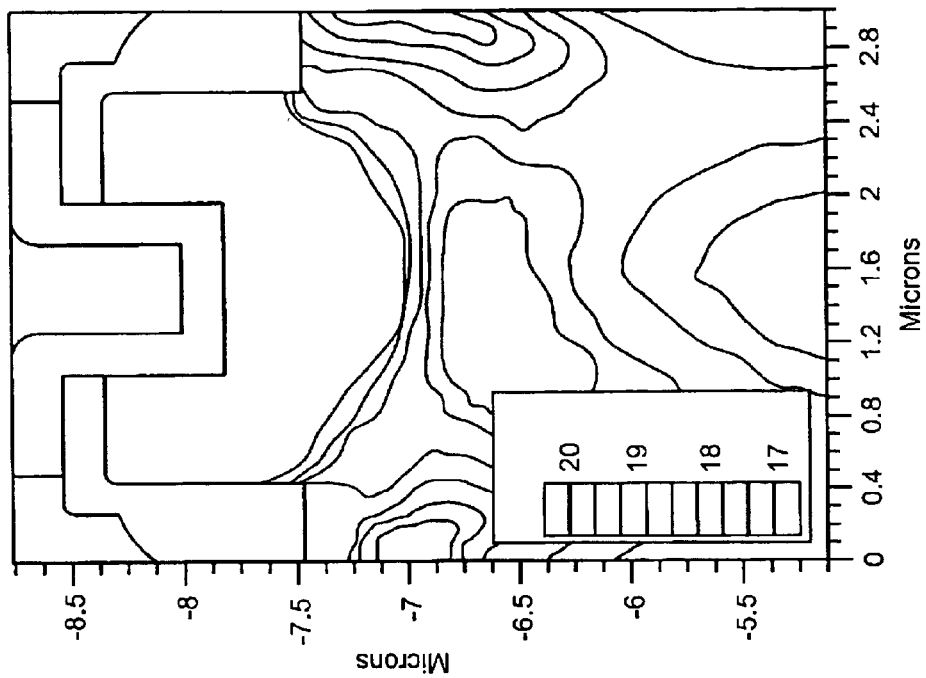
FIG. 7B shows the impact generation rate plot for the simulated device of FIG. 7A.
Figure 7A:
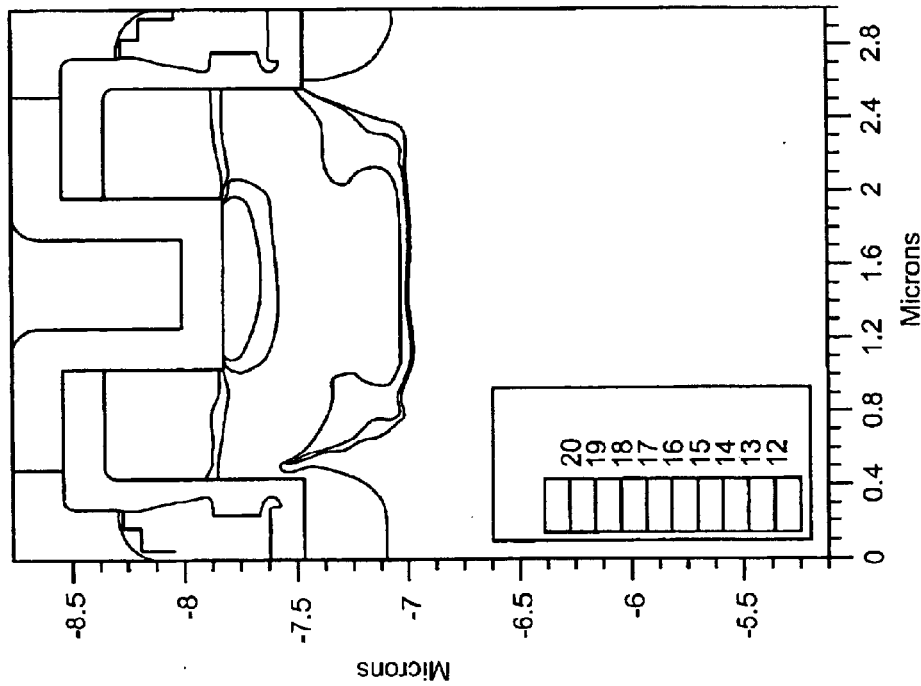
FIG. 7A shows the net doping profile for a simulated device according to the present invention.

FIGS. 7A and 7B show respectively plots of net doping and impact generation rate for another simulated device having the same channel region 12 as prior art device 1A, with a trench depth of 1.0 μm, and high conductivity regions 36 and field relief regions 38 according to the present inventions. In the simulated device shown by FIGS. 7A, and 7B field relief regions 38 merge with, but have a higher concentration of dopants than channel region 12, and approximately equal to the concentration of dopants in high conductivity regions 36. High conductivity regions 36 and field relief regions 38 thus form a superjunction feature, enabling the device to have a short channel (0.3 μm in this case). In the simulations the length of the channel was successfully reduced to 0.2 μm (not shown) before reaching an unacceptably low BV. It should be noted than in the simulated device shown by FIGS. 7A and 7B the location of breakdown is at the bottom of field relief regions 38.

TABLE 2

| Device | Trench Depth | R*AA | BV | Qg | R*Qg | R*Qg Improvement |
|---|---|---|---|---|---|---|
| Prior Art | 1.84 | 104 | 118 | 112 | 519 | |
| Simulated Device | 1.00 | 121 | 105 | 69 | 374 | 28% |

Table 2 provides data for comparing the simulated device of FIGS. 7A and 7B to the prior art device 1A. R*AA for the simulated device was scaled from measured data using the difference between simulated 1.9 μm trench standard structure and the simulated device. R*Qg was scaled from the measured data using trench depth reduction. As shown by Table 2, compared to the standard prior art device 1A, R*Qg of the simulated device of FIGS. 7A and 7B was improved by 28%, although its BV was reduced by 12%.

Figure 8A:
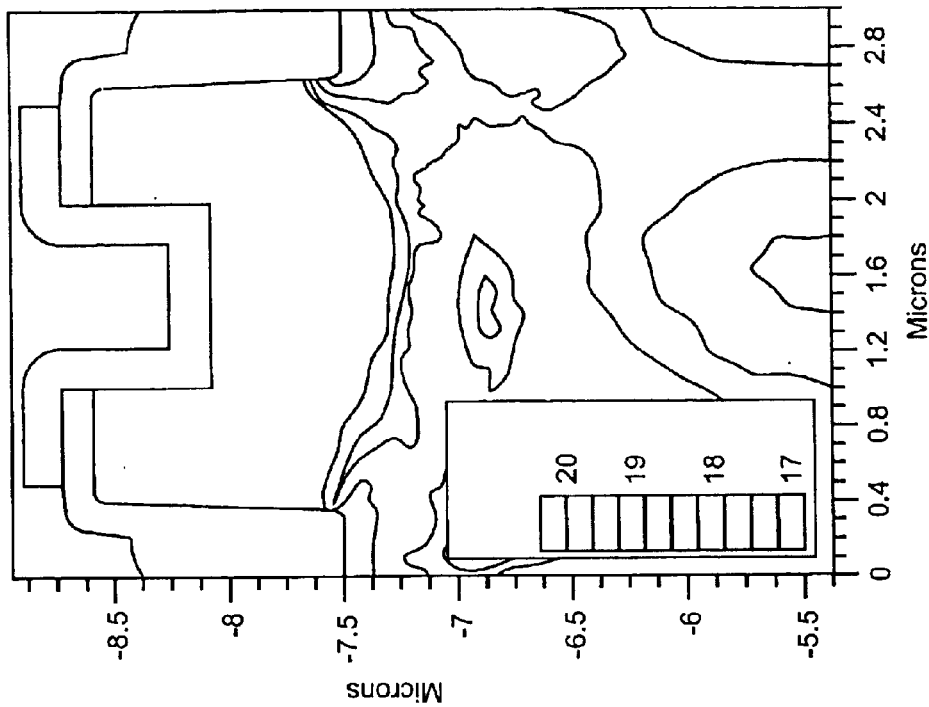
FIG. 8A shows the net doping profile for another simulated device according to the present invention.
Figure 8B:
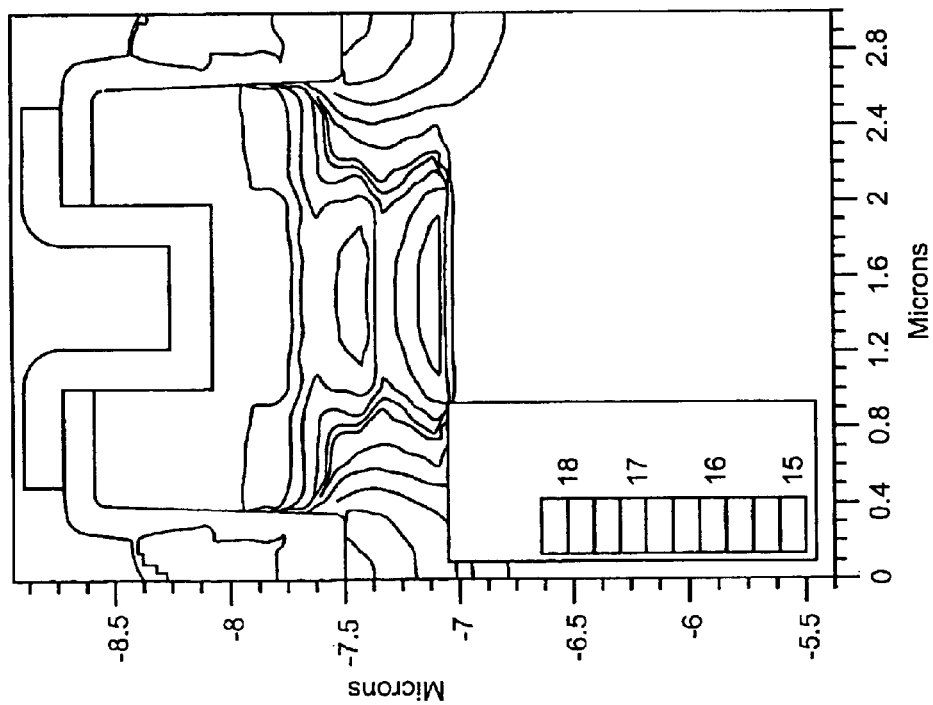
FIG. 8B shows the impact generation rate plot for the simulated device of FIG. 8A.

FIGS. 8A and 8B show respectively plots of net doping and impact generation rate for another simulated device which includes a shorter channel region 12, a trench depth of 1.1 μm, high conductivity regions 36 and field relief regions 38 according to the present invention. In the device shown by FIGS. 8A and 8B field relief regions 38 are merged with channel region 12 and extend below it. The dopant concentration in field relief regions 38 of the simulated device shown by FIGS. 8A and 8B is approximately equal to the concentration of dopants in high conductivity regions 36 thus forming a superjunction type feature, enabling the simulated device to have a short channel (approximately 0.24 μm in this case). It should be noted that in the simulated device shown by FIGS. 8A and 8B the location of breakdown is shared between field relief regions 38 and the bottom of trenches 10. As explained above, a higher concentration of dopants in field relief regions 38 would move the breakdown entirely into the silicon body.

Figure 9B:
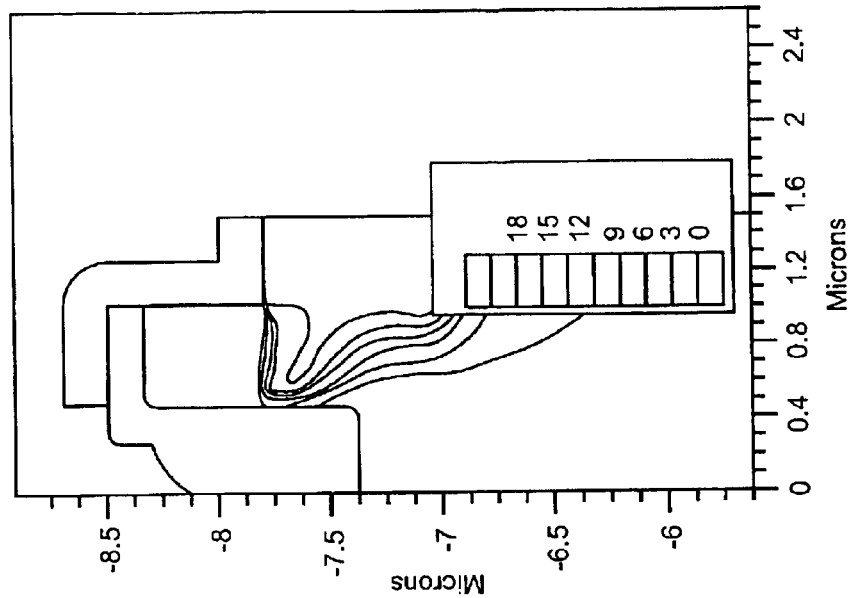
FIG. 9B is the electron concentration plot for the simulated device of FIG. 9A under Vgs=10V.
Figure 9A:
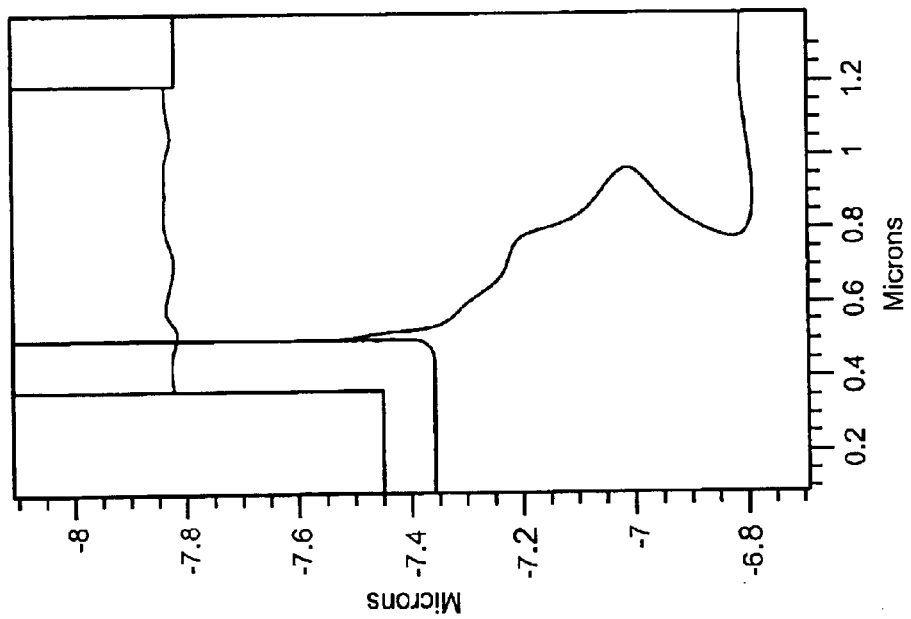
FIG. 9A is an enlarged view of the channel region in a simulated device according to the present invention.

FIG. 9 shows a close up of the channel region and electron concentration in the simulated device shown by FIGS. 8A and 8B under Vgs of about 10V. The very small gate to drain overlap should be noted. The small overlap may be achieved by the proper setting of the conditions used to implant and drive field relief regions 38.

Table 3 shows data for the simulated device of FIGS. 8A and 8B and a prior art device.

TABLE 3

| Device | Trench Depth | R*AA | BV | Qg | R*Qg | R*Qg Improvement |
|---|---|---|---|---|---|---|
| Prior Art | 1.84 | 104 | 118 | 112 | 519 | |
| Simulated Device | 1.10 | 113 | 117 | 74 | 374 | 28% |

In the simulated device R*AA was scaled from measured data using the difference between simulated 1.9 μm trench standard structure and the simulated device, and the R*Qg was scaled from measured data using trench depth reduction. As seen in Table 2, compared to the prior art device 1A, the R*Qg of the simulated device shown by FIGS. 8A and 8B was improved by 28%, but its BV was not changed.

The above simulations are shown as examples of the present invention. In the simulated devices, field relief regions 38 were formed with Boron implants at an energy in the range of 100 KeV to 2.5 MeV, with typical doses of about 4e12. As explained above the dose and implant energy can be varied to achieve the desired breakdown voltage.

In the simulated devices, the high conductivity regions 36 were formed with Arsenic or Phosphorus implants with energies in the range of 20–200 KeV, with typical doses of about 3e12. The doses and the energies of the implants can be varied to obtain the desired breakdown voltage. Higher energies can also be used for forming high conductivity regions 36. The widths of high conductivity regions 36 and field relief regions 38 can also be chosen so that their respective dopant concentrations are approximately equal in order to form a superjunction feature in the device.

There are several possible methods for forming high conductivity regions 36 at the bottom of each trench 10. One is to simply implant dopants after the trenches are formed. Another method is to etch the trench, perform the sacrificial oxidation, dry etch the oxide at the bottom of the trench, perform the implant, and then use a wet etch to remove the rest of the sacrificial oxide. This method offers the benefit of protecting the channel region from the implant. A third method is to implant through either the sacrificial or gate oxide. A fourth method is to use a high energy implant at some other stage in the process prior to trench etch, such that the implant will be placed at the appropriate location.

The simulations discussed herein were performed on 100V devices, but this invention is applicable over a wide range of voltages. Lower voltages may require narrower pitches to take advantage of the superjunction effect.

A device according to the present invention can be formed on top of a superjunction epitaxial layer, in which field relief regions 38 and high conductivity regions 36 extend to the substrate.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A MOSgated semiconductor device comprising:
   a trench receiving region of a first conductivity type having a top first surface;
   a common channel region of a second conductivity type formed in said trench receiving region and extending to a first depth below said top first surface;
   a plurality of spaced trenches formed in said trench receiving region through said common channel region;

a first region of a first conductivity type formed at the bottom of each trench, each said first region of said first conductivity type being adjacent to said trench receiving region and of a higher conductivity than said trench receiving region;

a plurality of conductive regions of said first conductivity type each disposed adjacent a trench;

a contact layer formed over said channel receiving region and in ohmic contact with said plurality of conductive regions; and field relief regions of said second conductivity type formed in said trench receiving region below said first depth, wherein said field relief regions are spaced from said channel region.

2. A device according to claim 1, wherein said trench receiving region is an epitaxial layer of semiconductive material formed over a substrate.

3. A device according to claim 2, further comprising a second contact formed over said substrate.

4. A device according to claim 3, wherein said second contact is a trimetal contact.

5. A device according to claim 1, further comprising high conductivity contact regions of said second conductivity type formed in said channel region and in ohmic contact with said contact layer.

6. A device according to claim 1, wherein said conductive regions are source regions.

7. A device according to claim 1, wherein each of said trenches is filled with a conductive material and lined at each side wall thereof with a gate insulation material.

8. A MOSgated semiconductor device comprising:

a semiconductor die having an epitaxial layer of a first conductivity type formed over a substrate;

a channel region of a second conductivity type formed in said epitaxial layer;

a plurality of spaced trenches formed in said epitaxial layer;

a first region of a first conductivity type formed at the bottom of each trench, each said first region of said first conductivity type being adjacent to said epitaxial layer and of a higher conductivity than said epitaxial layer;

a plurality of source regions of said first conductivity type each disposed adjacent a trench;

a source contact formed over said epitaxial layer and in ohmic contact with said plurality of source regions; wherein a conductivity of said first regions of said first conductivity type and a conductivity of said field relief regions are substantially equal.

9. A device according to claim 8, wherein said field relief regions are spaced from said channel region.

10. A device according to claim 8, wherein said substrate is a semiconductive material of the same conductivity type as said epitaxial layer but of higher conductivity.

11. A device according to claim 10, further comprising a drain contact formed over said substrate.

12. A device according to claim 11, wherein said drain contact comprises a trimetal contact.

13. A device according to claim 8, further comprising high conductivity contact regions of said second conductivity type formed in said channel region and in ohmic contact with said source contact.

14. A device according to claim 8, wherein each of said trenches is filled with a conductive material and lined at each side wall thereof with a gate insulation material.

15. A device according to claim 14, wherein said conductive material is polysilicon and said gate insulation material is oxide.

16. A device according to claim 1, wherein said trenches extend to a depth below said channel region.

17. A device according to claim 14, wherein said trenches extend to a depth below said channel region.

* * * * *